(12) United States Patent
Onishi

(10) Patent No.: US 9,787,320 B1
(45) Date of Patent: Oct. 10, 2017

(54) METHODS AND APPARATUS FOR AN ANALOG-TO-DIGITAL CONVERTER

(71) Applicant: SEMICONDUCTOR COMPONENTS INDUSTRIES, LLC, Phoenix, AZ (US)

(72) Inventor: Akinobu Onishi, Ota (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/454,381

(22) Filed: Mar. 9, 2017

Related U.S. Application Data

(63) Continuation of application No. 15/276,943, filed on Sep. 27, 2016, now Pat. No. 9,628,101.

(51) Int. Cl.
*H03M 1/12* (2006.01)
*H03M 3/00* (2006.01)

(52) U.S. Cl.
CPC .......... *H03M 3/464* (2013.01); *H03M 1/12* (2013.01); *H03M 1/1245* (2013.01); *H03M 3/422* (2013.01)

(58) Field of Classification Search
CPC ..... H03M 3/464; H03M 3/422; H03M 1/1245
USPC .................. 341/155, 144, 120, 143
See application file for complete search history.

(56) References Cited

U.S. PATENT DOCUMENTS

| | | | |
|---|---|---|---|
| 4,910,797 A | 3/1990 | Min et al. | |
| 4,970,411 A * | 11/1990 | Halg | H01L 27/22 257/423 |
| 8,823,566 B2 * | 9/2014 | Atriss | H03M 1/187 341/139 |
| 8,981,972 B2 * | 3/2015 | Shen | H03M 1/38 341/118 |
| 9,077,360 B2 | 7/2015 | Dasgupta et al. | |
| 9,281,835 B2 | 3/2016 | Cohen et al. | |
| 9,325,339 B2 | 4/2016 | Cowley et al. | |
| 9,564,914 B1 * | 2/2017 | Mallett | H03M 1/1009 |
| 2004/0134988 A1 | 7/2004 | Pettinelli | |
| 2004/0233081 A1 | 11/2004 | Cesura | |
| 2006/0284750 A1 | 12/2006 | Keskin | |
| 2012/0112937 A1 | 5/2012 | Yamase | |

FOREIGN PATENT DOCUMENTS

| | | |
|---|---|---|
| JP | H07221645 | 8/1995 |
| JP | 2007312084 | 11/2007 |
| JP | 2010045639 | 2/2010 |
| JP | 2014200116 | 10/2014 |

* cited by examiner

*Primary Examiner* — Brian Young
(74) *Attorney, Agent, or Firm* — The Noblitt Group, PLLC

(57) ABSTRACT

Various embodiments of the present technology may comprise a method and apparatus for an analog-to digital converter (ADC). Methods and apparatus for an ADC according to various aspects of the present invention may operate in conjunction with a reference voltage that varies according to the frequency of a timing signal. By varying the reference voltage according to the frequency of the timing signal, the ADC generates a digital output having a substantially fixed voltage regardless of the frequency of the timing signal.

20 Claims, 11 Drawing Sheets

METHODS AND APPARATUS FOR AN ANALOG-TO-DIGITAL CONVERTER

CROSS-REFERENCE TO RELATED APPLICATION

This application is a continuation of U.S. patent application Ser. No. 15/276,943, filed on Sep. 27, 2016, and incorporates the disclosure of the application in its entirety by reference.

BACKGROUND OF THE TECHNOLOGY

Analog-to-digital converters (ADCs) are utilized in a variety of electronic devices and systems to transform an analog signal to a digital signal. One ADC architecture commonly used is the delta-sigma ADC. The differentiating aspects of the delta-sigma ADCs include the use of over-sampling in conjunction with decimation filtering and quantization noise shaping. Advantageous characteristics of the delta-sigma ADC include high resolution and high stability. Due to these characteristics, delta-sigma ADCs are frequently chosen for use in audio systems, such as hearing devices, microphones, and the like.

Due to the low operating voltage of many devices which employ the delta-sigma ADCs, the signal-to-noise ratio (SNR) performance and dynamic range can be greatly diminished. The dynamic range of a system may be described as the range of amplitudes between a noise component of the system and the onset of clipping (the level at which the power supply is no longer adequate to provide larger waveforms), while the SNR may be described as the ratio of a signal component (at some arbitrary level) to a noise component.

Many audio applications require enhanced SNR performance and dynamic range while maintaining particular design specifications, such as the operating voltage, oversampling ratio, and total area of the chip size.

Delta-sigma ADCs commonly employ a digital signal processor to correct over-amplified signals, remove noise components, and the like. Digital signal processors typically required to process a wide voltage range, comprise multiple circuits that include numerous components, and generally occupy a large area on the chip.

SUMMARY OF THE INVENTION

Various embodiments of the present technology may comprise methods and apparatus for an analog-to-digital converter (ADC). Methods and apparatus for an ADC according to various aspects of the present invention may operate in conjunction with a reference voltage that varies according to the frequency of a timing signal. By varying the reference voltage according to the frequency of the timing signal, the ADC generates a digital output having a substantially fixed voltage regardless of the frequency of the timing signal.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various semiconductor devices, such as transistors, capacitors, and the like, which may carry out a variety of functions. In addition, the present technology may be practiced in conjunction with any number of electronic systems, such as automotive, aviation, and consumer electronics, and the systems described are merely exemplary applications for the technology. Further, the present technology may employ any number of conventional techniques for signal sampling, signal filtering, signal quantization, and the like.

Methods and apparatus for a delta-sigma ADC according to various aspects of the present technology may operate in conjunction with any suitable electronic system, such as an audio system, a microphone system, a video telephone, an acoustics system, hearing devices, and the like.

Figure 1:
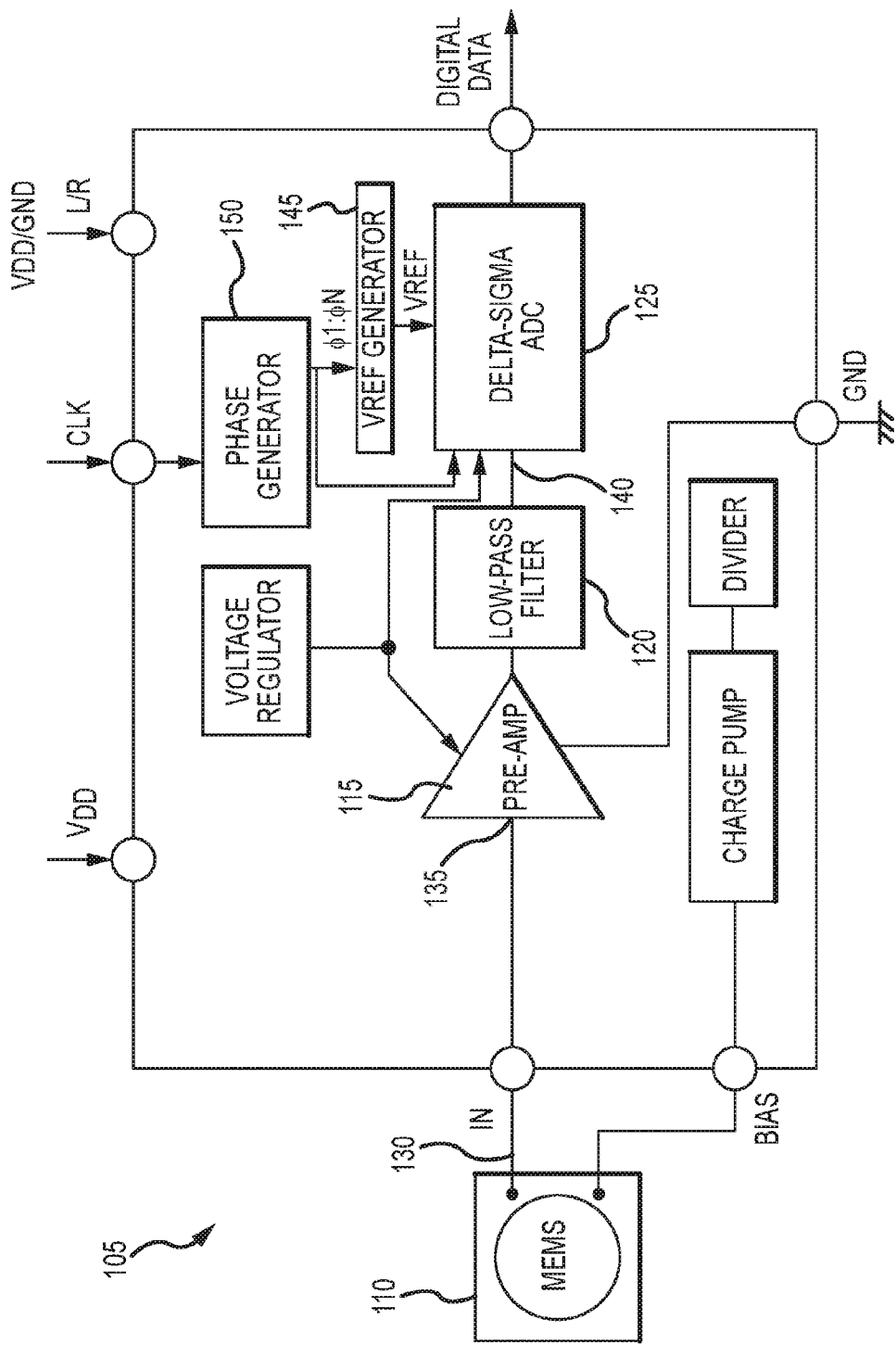
FIG. 1 is a block diagram of a system in accordance with an exemplary embodiment of the present technology.

Referring to FIG. 1, an electronic device according to various aspects of the present technology may comprise an audio system, in this case a digital micro electro-mechanical system (MEMS) microphone integrated chip 105. The system may comprise a MEMS device 110, a pre-amplifier 115, a first filter 120, and an ADC 125.

In various embodiments, the MEMS device 110 may convert sound into an electrical signal, for example with the use of a pressure-sensitive diaphragm. The MEMS device 110 may be fabricated using conventional MEMS processing techniques. The source of the analog signal may comprise, however, any suitable source of analog signals, such as a microphone, sensor, or signal generator.

An output 130 of the MEMS device 110 may be coupled, directly or indirectly, to an input terminal 140 of the ADC 125. The output 130 signal generated by the MEMS device 110 may be initially processed, such as to amplify and/or filter the output 130 signal. For example, the pre-amplifier 115, the first filter 120, and the ADC 125 may be coupled in series. The pre-amplifier 115 and the first filter 120 may be fabricated according to any appropriate conventional semiconductor materials and techniques.

In various embodiments, the IC 105 may be coupled to or include a clock generator or other timing circuit (not shown) for producing a clock signal CLK. The clock signal CLK may be transmitted to an input of the IC 105. The clock generator may produce a symmetrical square wave and/or other suitable waveforms. In various embodiments, the clock generator may be formed from a resonant circuit and an amplifier. The clock generator may be formed on the same chip as the IC 105 or on a companion chip.

A phase generator 150 may generate timing signals, for example using the clock signal CLK. In the present embodiment, the phase generator 150 generates multiple timing signals φ1:φN to operate various switches in the IC. In various embodiments, the phase generator 150 may generate non-overlapping two-phase timing signals with a first phase φ1 and a second phase φ2. In an alternative embodiment, the phase generator 150 may produce non-overlapping four-phase timing signals with first, second, third, and fourth phases φ1, φ2, φ3, φ4, which may provide increased performance. The phase generator 150 may be formed using conventional methods and components.

In various embodiments, the IC 105 may process the output 130 signal prior to the analog-to-digital conversion, for example to inhibit aliasing and/or produce a signal with a desired precision. For example, the IC 105 may include the first filter 120, such as a low-pass filter to pass input analog signals $A_{IN}$ with frequencies below a predetermined frequency and attenuate signals with frequencies above a predetermined frequency. In various embodiments, the first filter 120 may be configured as an analog filter. In various embodiments, the first filter 120 may be fabricated using passive elements, such as a resistive element R and/or a capacitor $C_{LP}$, for example because such passive elements may be small in size and consume less current than active elements, such as a transistor. In an exemplary embodiment, the resistive element R and the capacitor $C_{LP}$ are coupled in series.

Figure 2:
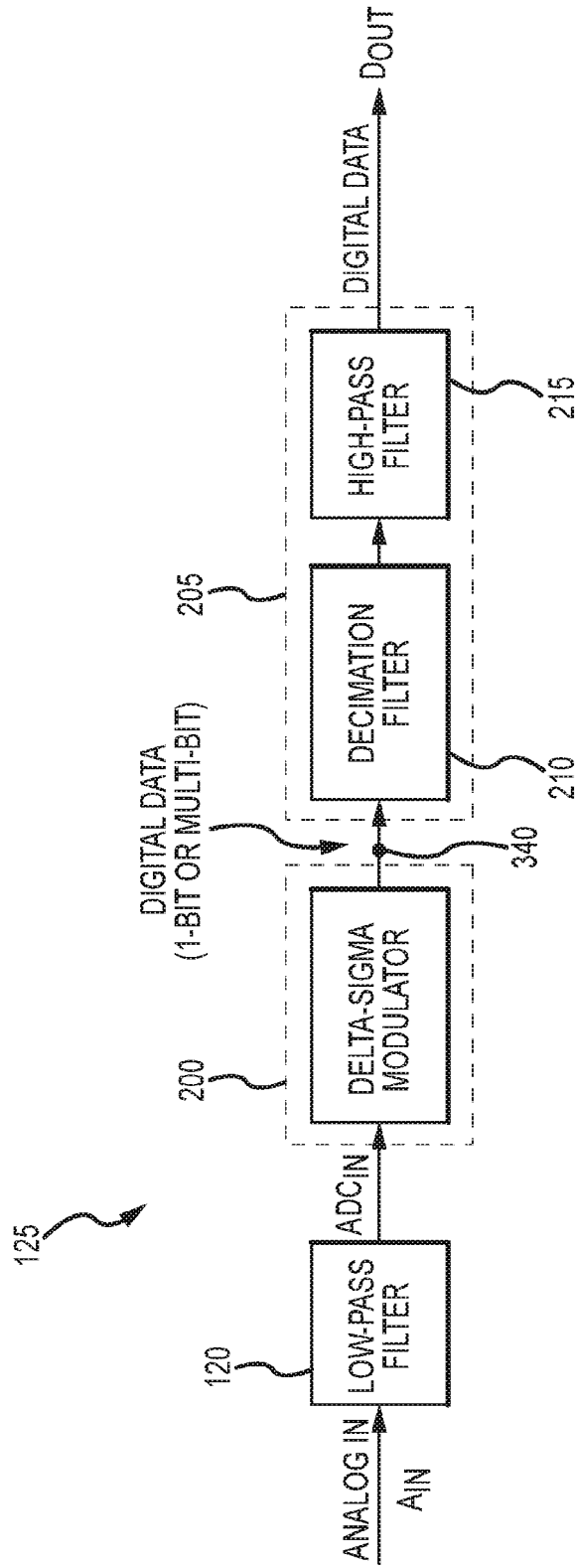
FIG. 2 is a block diagram of an analog-to-digital converter in accordance with an exemplary embodiment of the present technology.

Referring to FIG. 2, in an exemplary embodiment, the ADC 125 may be configured as a delta-sigma ADC coupled in series with the first filter 120 and/or the pre-amplifier 115. The ADC may be configured in any suitable manner for the particular application and/or environment. In various embodiments, the ADC 125 may comprise a delta-sigma modulator 200 and a digital circuit 205 for converting an input signal $ADC_{IN}$ into a digital signal $D_{OUT}$. In one embodiment, the digital circuit 205 comprises a decimation filter 210 and a second filter 215. In various embodiments, the second filter 215 may comprise a high-pass filter for filtering out signals below a predetermined frequency. The digital circuit 205 may be formed on the same chip as the IC 105 or on a companion chip, and may comprise any suitable system for processing the output 340 of the delta-sigma modulator 200 for use as a digital output signal.

Figure 3:
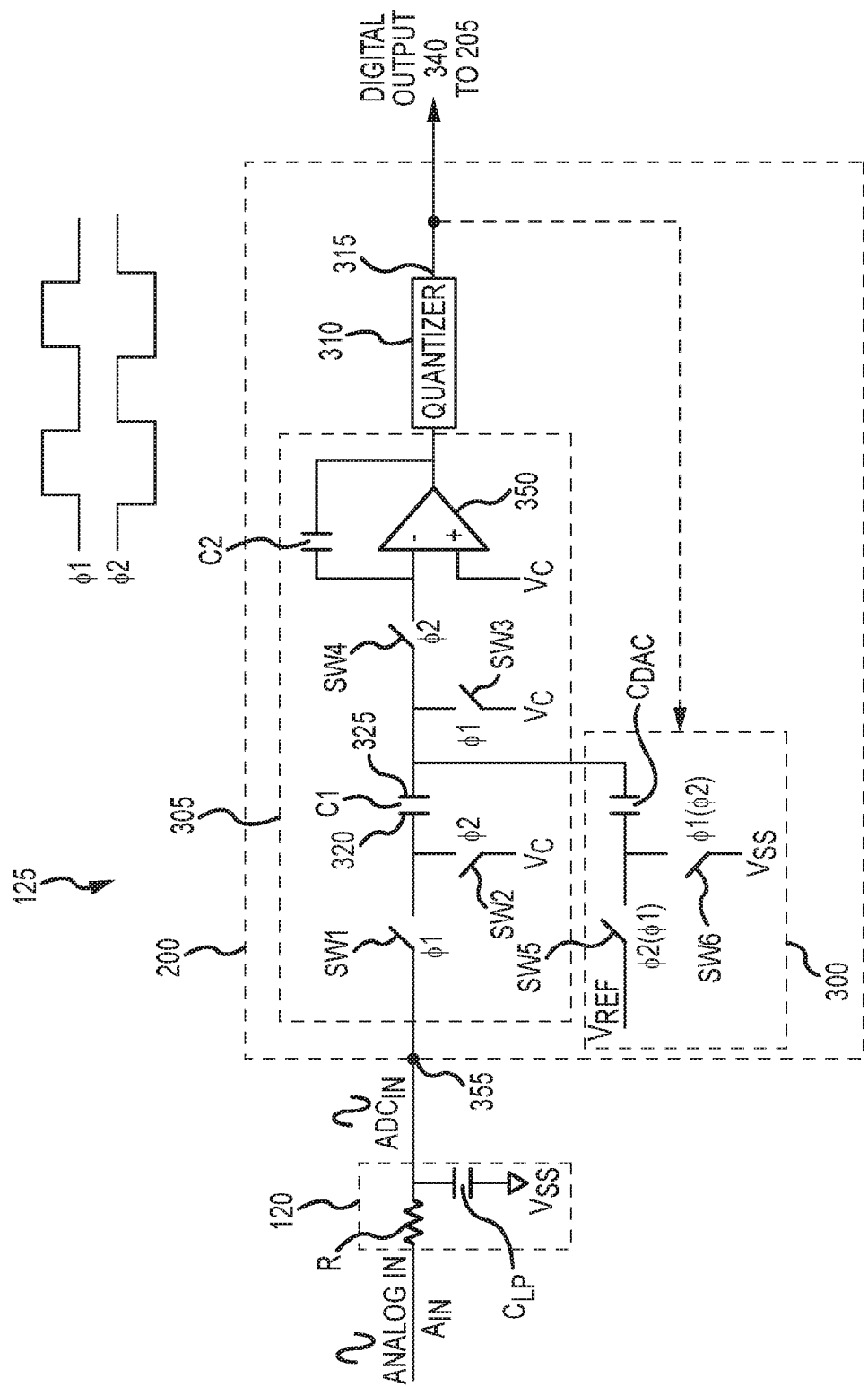
FIG. 3 is a circuit schematic of an analog-to-digital converter in accordance with an exemplary embodiment of the present technology.

Referring to FIG. 3, an exemplary delta-sigma modulator 200 may comprise an integrator 305, a feedback digital-to-analog converter (DAC) 300, and a quantizer 310. In various embodiments, the integrator 305 may comprise a switched-capacitor type integrator comprising first, second, third, and forth switching devices SW1, SW2, SW3, SW4, a sampling capacitor C1, and an operational-amplifier 315 with a feedback capacitor C2 to integrate samples of the input voltage. The integrator 305 may be formed utilizing any suitable technology and/or fabrication methods, such as CMOS technology.

The sampling capacitor C1 may store an electric charge based on a sampled voltage. A first plate 320 of the sampling capacitor C1 may be selectively coupled to an input terminal 355 via the first switching device SW1, and second plate 325 of the sampling capacitor C1 may be selectively coupled to the op-amp 400 via the fourth switching device SW4. The integrator 305 may utilize the second switching device SW2 to selectively couple the first plate 320 of the sampling capacitor C1 to the common-mode voltage Vc during a phase opposite of the first switching device SW1, and utilize the third switching device SW3 to selectively couple the second plate 325 of the sampling capacitor C1 to the common-mode voltage Vc during a phase opposite that of the fourth switching device SW4.

The feedback capacitor C2 may be coupled between an output terminal of the op-amp 350 the negative input terminal. Operation of the various switching devices SW1, SW2, SW3, SW4 integrates the electric charge stored in the sampling capacitor C1.

In an exemplary embodiment, since the resistive element R of the first filter 120 and the integrator 305 are connected in series, the impedance of the resistive element R does not vary according to the frequency f of the timing signals φ1:φN, but the input impedance of the switched-capacitor integrator 305 does vary according to the frequency f of the timing signals φ1:φN. Therefore, a voltage $V_{ADC\_IN}$ of the input signal $ADC_{IN}$ is described as:

$$V_{ADC\_IN} = \frac{1}{C1 \times R \times f + 1} \times V_{Analog\_IN},$$

where C1 is a capacitance of the sampling capacitor C1, R is a resistance of the resistive element R, and f is the frequency of the timing signals φ1:φN. As such, the voltage $V_{ADC\_IN}$ of the input signal $ADC_{IN}$ varies according to the frequency f of the timing signals φ1:φN.

In various embodiments, the integrator 305 may be coupled in series with the quantizer 310 to map the sampled voltages to a digital value. An output terminal 315 of the quantizer 320 may be connected to an input of the digital circuit 205. In various embodiments, the quantizer 310 may transmit a digital output 340, for example a single-bit value or a multi-bit value, to the digital circuit 205. The output terminal 315 of the quantizer 320 may also be coupled to the integrator 305 via the DAC 300.

In an exemplary embodiment, the DAC 300 is coupled between an output terminal 315 of the quantizer 310 and the integrator 305 to create a feedback loop to ensure that a replica of the input signal $ADC_{IN}$ is generated by the DAC 300. In various embodiments, the DAC 300 may operate based on a signal from the quantizer 310. The DAC 300 may comprise a single-bit DAC or a multi-bit DAC. For example, if the quantizer 310 outputs a multi-bit value, then the DAC 300 may be matched to the bit value of the quantizer 310.

The DAC 300 may comprise switching devices, for example fifth and sixth switching devices SW5, SW6, to couple to the reference voltage $V_{REF}$ and a ground $V_{SS}$, and to charge a capacitor $C_{DAC}$. For example, the fifth and sixth switching devices SW5 and SW6 may charge the capacitor $C_{DAC}$ by opening and closing based on the digital output 340 of the quantizer 310.

In an exemplary embodiment, when the quantizer 310 outputs a logic high value (e.g., logic "1"), the sixth switching device SW6 closes during the first phase (while the fifth switching device SW5 is open), and the fifth switching device SW5 closes during the second phase (while the sixth switching device SW6 is open). This sequence of switching reduces the electric charge on the feedback capacitor C2 and the output level of the op-amp 350 is decreased.

When the quantizer 310 outputs a logic low value (e.g., logic "0"), the fifth switching device SW5 closes during the first phase $\phi1$ (while the sixth switching device SW6 is open), and the sixth switching device SW6 closes during the second phase $\phi2$ (while the fifth switching device SW5 is open). This sequence of switching increases the electric charge on the feedback capacitor C2 and the output level of the op-amp 350 is increased.

Figure 4:
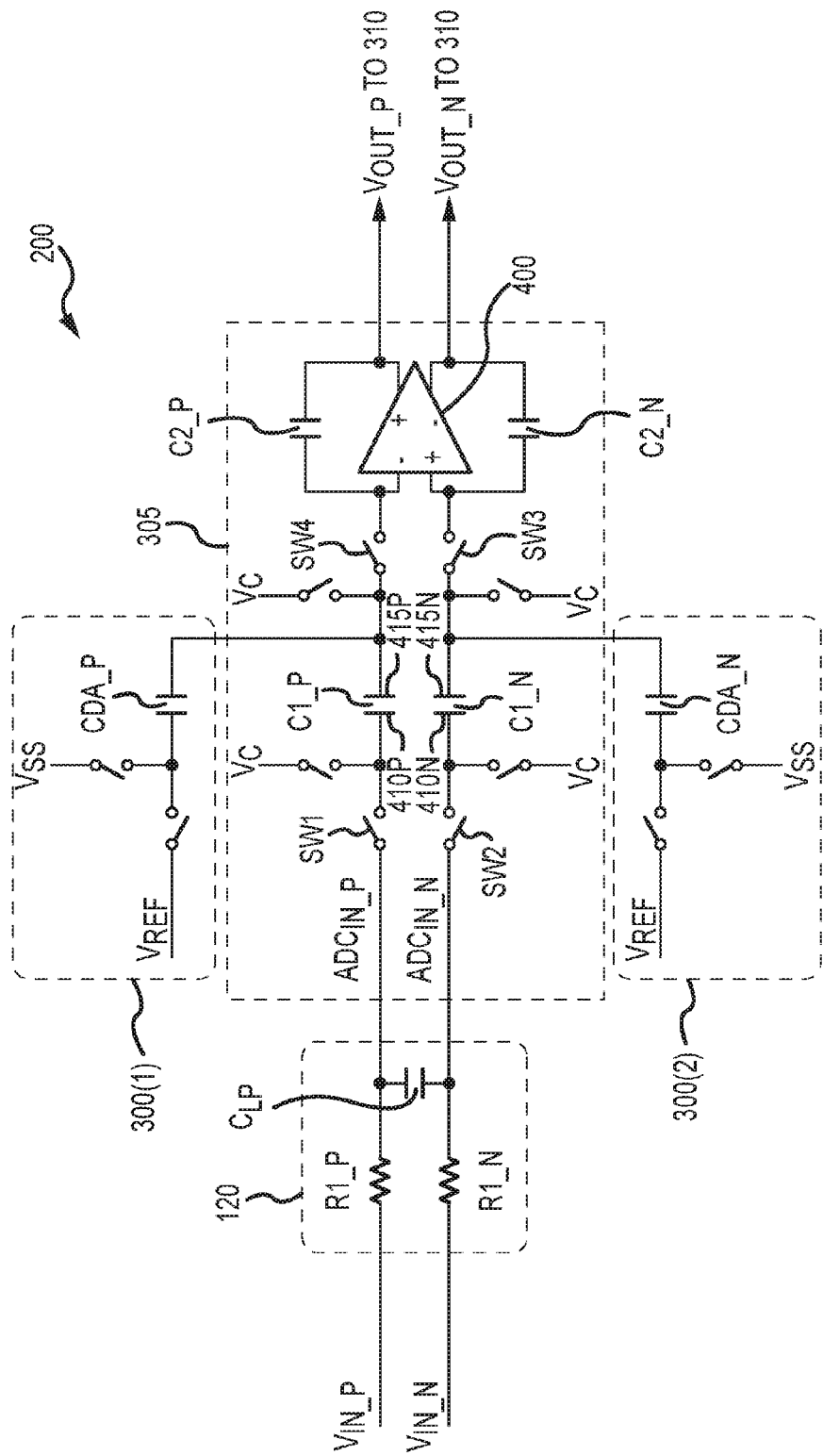
FIG. 4 is an integrator circuit of an analog-to digital in accordance with an exemplary embodiment of the present technology.

Referring to FIG. 4, in various embodiments, the delta-sigma modulator 200 may comprise a fully differential switched capacitor type integrator 305 having a positive input terminal, a negative input terminal, and two output terminals supplying differential voltages $V_{OUT\_P}$, $V_{OUT\_N}$ symmetrical to a common-mode voltage Vc. The integrator 305 may be connected to a positive input voltage $V_{IN\_P}$ and a negative input voltage $V_{IN\_N}$.

The fully differential switched capacitor type integrator may comprise first and second sampling capacitors $C1_P$, $C1_N$, a plurality of switching devices SW1:SW4, and an operational amplifier 400 with first and second feedback capacitors $C2_P$, $C2_N$. The fully differential switched capacitor type integrator 305 may also comprise first and second DACs 300(1), 300(2). The first DAC 300(1) may be coupled to the first sampling capacitor $C1_P$ and the second DAC 300(2) may be coupled to the second sampling capacitor $C1_N$. In various embodiments, the switching devices SW1:SW4 may comprise transistors and may receive timing signals $\phi1$:$\phi$N provided by the phase generator 150.

First plates $410_P$, $410_N$ of each of the sampling capacitors $C1_P$, $C1_N$ may be selectively coupled to the input terminals $V_{IN\_P}$, $V_{IN\_N}$ via the switching devices SW1, SW2, and second plates $410_P$, $410_N$ of each of the sampling capacitors $C1_P$, $C1_N$ may be selectively coupled to the op-amp 400 via the switching devices SW3, SW4.

Each feedback capacitor $C2_P$, $C2_N$ may be coupled between one output terminal of the op-amp 400 and one of the positive input terminal and the negative input terminal. For example, the first feedback capacitor $C2_P$ may be coupled between the positive output terminal and the negative input terminal, while the second feedback capacitor $C2_N$ may be coupled between the negative output terminal and the positive input terminal. A common-mode voltage Vc may also be selectively coupled to the negative input terminal and the positive input terminal the op-amp 400 via switching devices SW4, SW3, respectively.

Figure 5:
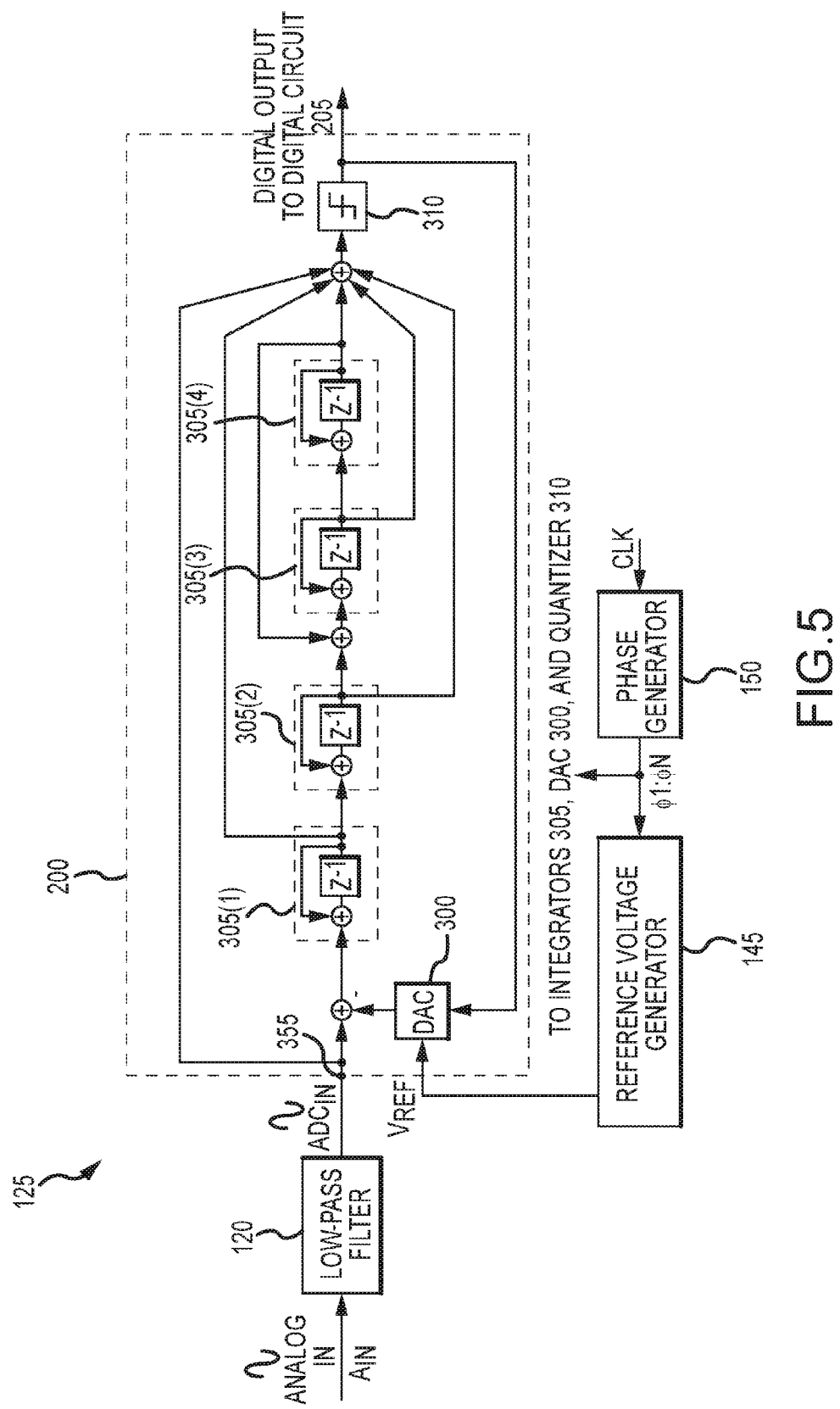
FIG. 5 is a block diagram of an analog-to-digital converter in accordance with an exemplary embodiment of the present technology.

According to various embodiments, the delta-sigma modulator 200 may be arranged in various configurations according to a particular application. For example, the delta-sigma modulator 200 may comprise a feed-forward configuration, a feedback configuration, or a cascaded configuration. Additionally, the delta-sigma modulator 200 may be implemented as a discrete-time modulator. Discrete-time modulators may be implemented with switched-capacitor integrators and expressed in the Z-domain. The topology may be selected according to design choices for a particular application. Additionally, the order of the delta-sigma modulator may be selected according to desired noise-shaping characteristics. For example, and referring to FIG. 5, the delta-sigma ADC 125 may comprise a discrete-time, fourth-order delta-sigma modulator 200.

In an exemplary embodiment, the IC 105 may further comprise a reference voltage generator 145 to generate a reference voltage $V_{REF}$ based on a frequency of one or more signals, such as the timing signals $\phi1$:$\phi$N. According to various embodiments, the reference voltage generator 145 generates a variable reference voltage $V_{REF}$ based on the frequency f of the timing signals $\phi1$:$\phi$N, which also varies. The reference voltage generator 145 may comprise any appropriate components to generate the reference voltage according to the relevant frequency, including any appropriate number of transistors, capacitive elements, resistive elements, and the like.

Figure 6:
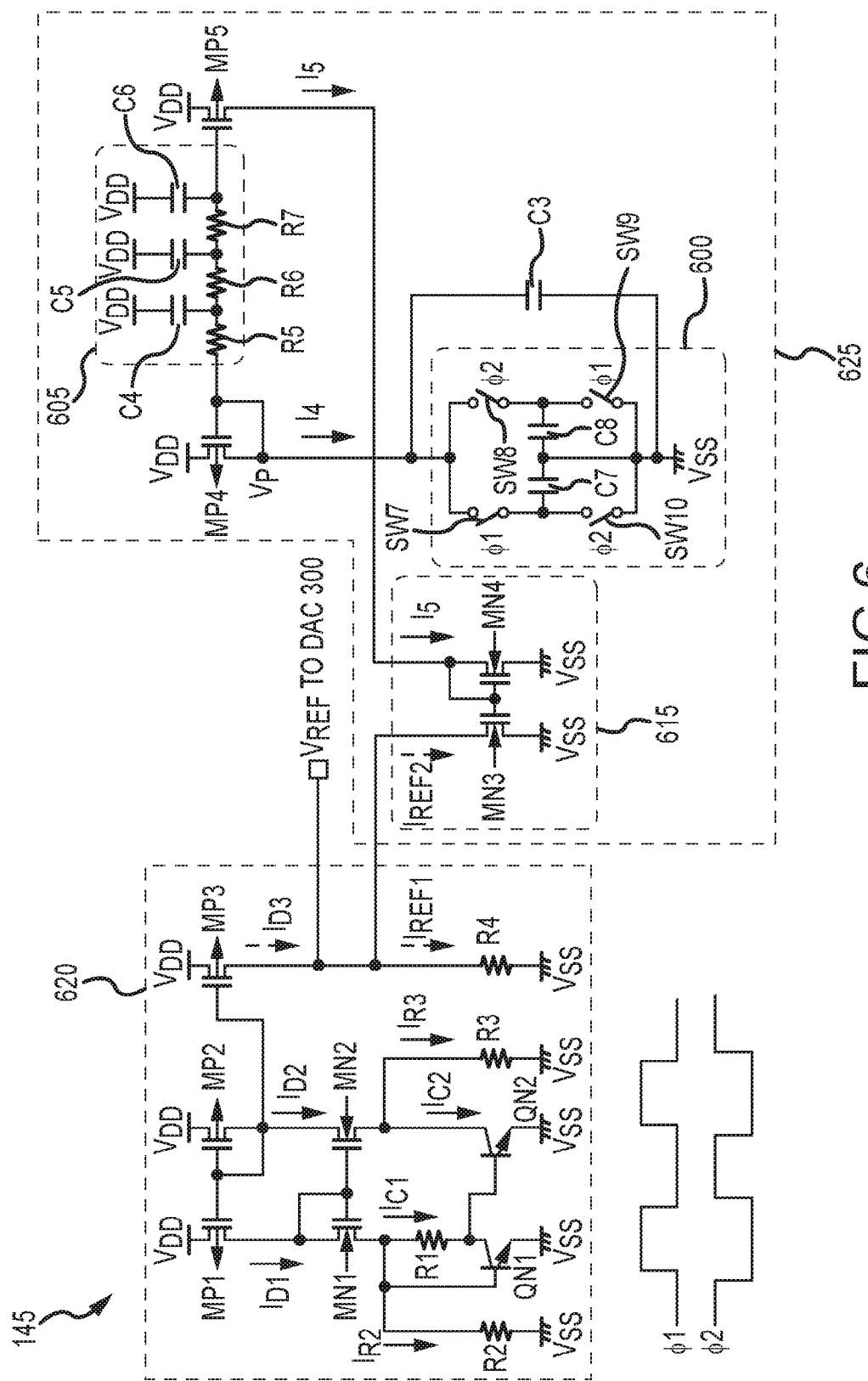
FIG. 6 is circuit schematic of a reference voltage generator in accordance with an exemplary embodiment of the present technology.
Figure 7:
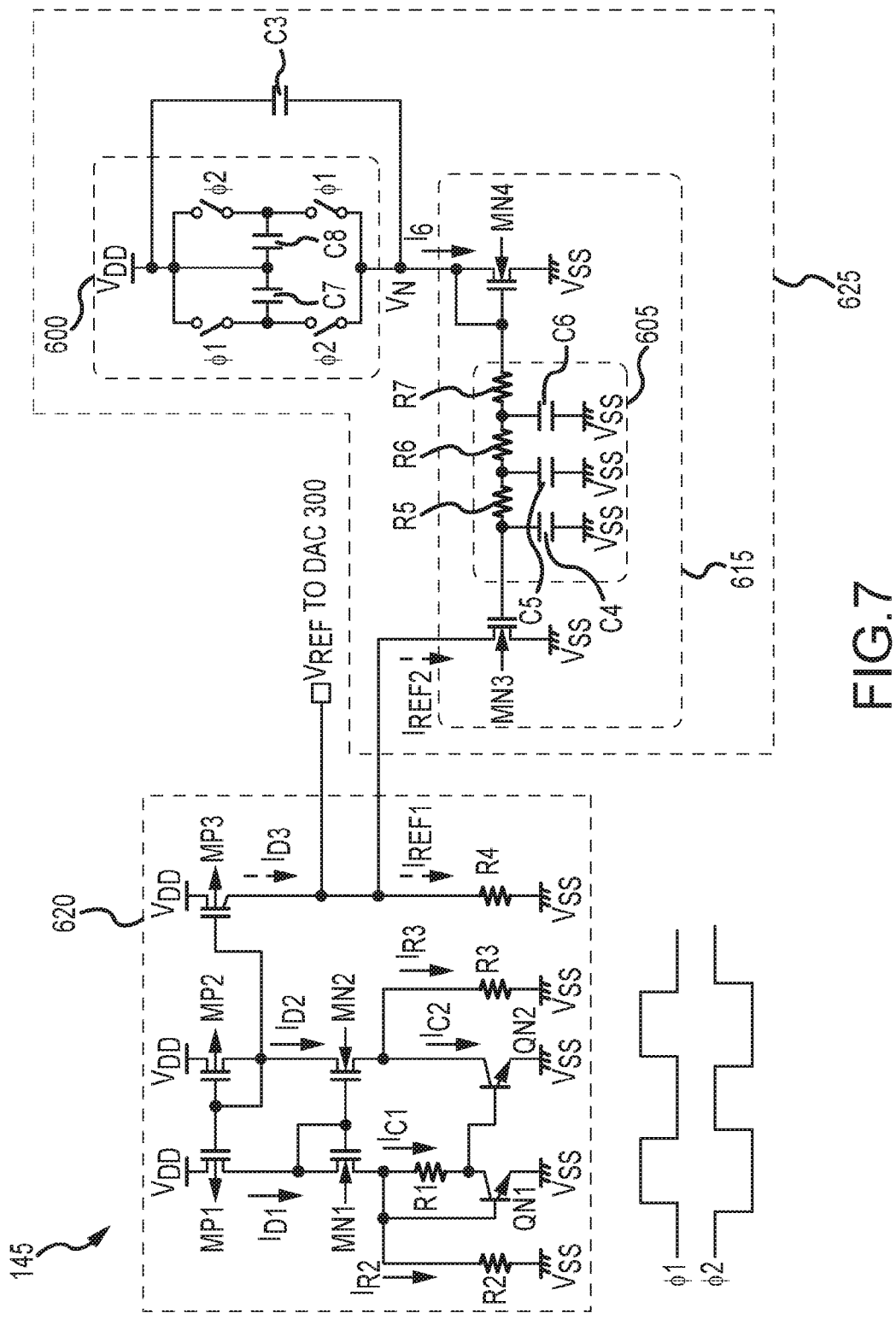
FIG. 7 is circuit schematic of a reference voltage generator in accordance with an exemplary embodiment of the present technology.

Referring to FIGS. 6 and 7, an exemplary the reference voltage generator 145 may comprise a primary circuit 620 for generating a drain current $I_{D3}$ and the resulting variable reference voltage $V_{REF}$.

The primary circuit 620 may comprise a circuit for providing a band-gap reference voltage, such as a band-gap reference voltage. According to various embodiments, the primary circuit 620 may comprise a plurality of transistors MP1, MP2, MP3, MN1, MN2, QN1, QN2, and a plurality of resistive elements, such as resistors R1, R2, R3, R4. The primary circuit 620 may exhibit various temperature characteristics. For example, the reference voltage $V_{REF}$ can be adjusted to a desired temperature coefficient by, for example, adjusting the value of the resistors R2, R1, since the temperature coefficient of a base-emitter voltage $V_{BE1}$ is a negative value (e.g., approximately −2 mV/° C.) and the temperature coefficient of a thermal voltage $V_T$, where $V_T=(k*T)/q$, is a positive value (e.g., approximately 0.09 mV/° C.).

The current at various points may be defined as first, second, and third drain currents $I_{D1}$, $I_{D2}$, $I_{D3}$, second and third currents across resistors R2 and R3, respectively, $I_{R2}$, $I_{R3}$, and first and second collector currents $I_{C1}$, $I_{C2}$, where $I_{D1}=I_{R2}+I_{C1}$. Therefore:

$$I_{D1} = \frac{V_{BE1}}{R2} + \frac{1}{R1} \times \frac{kT}{q} \times \ln\left(\frac{N}{M}\right),$$

where k is Boltzmann's constant, T is temperature in Kelvin, and $V_{BE1}$ is a base-emitter voltage of transistor QN1, q is the magnitude of the electrical charge on the electron, and M and N are the number of transistors that equal the equivalent transistors QN1 and QN2, respectively. If transistors MP1, MP2, and MP3 are equally sized, then $I_{D3}=I_{D2}=I_{D1}$.

In the case where only the primary circuit 620 is considered, the drain current $I_{D3}$ is not based on the frequency f of the timing signals $\phi1$:$\phi$N, and can be described as follows:

$$I_{D3} = \frac{V_{BE1}}{R2} + \frac{1}{R1} \times \frac{kT}{q} \times \ln\left(\frac{N}{M}\right).$$

As such, the reference voltage $V_{REF}$ can be described as follows: $V_{REF}=I_{D3} \times R4$, therefore $$V_{REF} = \frac{R4}{R2} \times \left[ V_{BE1} + \frac{R2}{R1} \times \frac{kT}{q} \times \ln\left(\frac{N}{M}\right) \right].$$

As such, when the only the primary circuit 620 is considered, the reference voltage $V_{REF}$ is not based on the frequency f of the timing signals φ1:φN, and in this case, a full scale voltage of the ADC 125 does not vary. Therefore, when the input $ADC_{IN}$, which varies according to the frequency f of the timing signals φ1:φN, is converted into a digital signal, the signal of the digital output 340 will also vary according to the frequency f of the timing signals φ1:φN because the full scale voltage range is different than the variation (range) of the input $ADC_{IN}$.

In various embodiments, the reference voltage generator 145 may further comprise a secondary circuit 625 coupled to the primary circuit 620 to generate a first reference current $I_{REF1}$ and a second reference current $I_{REF2}$ to effect a change of the drain current $I_{D3}$ and the resulting variable reference voltage $V_{REF}$ based on a frequency f of the timing signals φ1:φN. In various embodiments, the secondary circuit 625 may comprise any number of transistors, capacitive elements, resistive elements, and the like.

In an exemplary embodiment, the secondary circuit 625 of the reference voltage generator 145 comprises a filter 605 for removing selected frequency components of the signal. For example, the filter 605 may comprise a low-pass filter to remove high frequency components of the signal, such as clock noise. The filter 605 may provide a stable voltage to a gate of a transistor, and therefore produce a stable current, which is used to obtain the variable reference voltage $V_{REF}$.

In various embodiments, the filter 605 may comprise a plurality of capacitive elements, for example conventional capacitors C4, C5, C6, each capacitor coupled to a source voltage $V_{DD}$ or a ground voltage $V_{SS}$, and resistive elements, for example conventional resistors R5, R6, R7, coupled to the capacitors. In various embodiments, the filter 605 is coupled between two transistors MP4, MP5, wherein the transistors MP4, MP5 form a first current mirror.

In various embodiments, the reference voltage generator 145 may further comprise a variable resistor 600 that has an equivalent resistance that changes based on the frequency f of the timing signals φ1:φN. The variable resistor 600 generates a variable current based on the frequency f of the timing signals φ1:φN. In an exemplary embodiment, the variable resistor 600 comprises a switched-capacitor resistor. The variable current is then used to obtain the variable reference voltage $V_{REF}$, which is based on the frequency f of the timing signals φ1:φN.

In various embodiments, the variable resistor 600 may comprise a plurality of capacitive elements, for example conventional capacitors, C7, C8, and a plurality of switching devices SW7, SW8, SW9, SW10, coupled to the capacitors. The switching devices SW7, SW8, SW9, SW10 may receive the timing signals φ1:φN and operate (open and close) based on the frequency of each signal. Accordingly, the switching devices SW7, SW8, SW9, SW10 charge the capacitors C7, C8 to a voltage level corresponding to the operation (frequency of opening and closing) of the switching devices SW7, SW8, SW9, SW10.

In various embodiments, the secondary circuit 625 may further comprise a capacitive element C3 coupled to the variable resistor 600. The capacitive element C3 may assist to remove noise from the timing signals φ1:φN.

In various embodiments, the secondary circuit 625 may further comprise a second current mirror 615 to provide a bias current, for example the second reference current $I_{REF2}$. The second current mirror 615 may comprise two transistors MN3, MN4, wherein the gate terminals of the transistors are coupled and a drain terminal of one transistor is also coupled to the gate terminals. In an exemplary embodiment, and referring to FIG. 7, the filter 605 may be coupled between the transistors MN3, MN4.

In various embodiments, the variable resistor 600 and the filter 605 are coupled in series in any suitable order.

Referring to FIG. 6, when the secondary circuit 625 is considered with the primary circuit 620, the source current $I_4$ is as follows:

$$I_4 = \frac{1}{2} \times \mu_P \times C_{ox} \times \left(\frac{W}{L}\right)_{MP4} \times (V_{DD} - V_P - V_{th\_MP4})^2,$$

where $\mu_p$ is mobility, $C_{ox}$ is the capacitance of the gate oxide film per unit area, W/L is the aspect ratio, $V_p$ is the voltage across the variable resistor 600, $V_{th}$ is the threshold voltage, and $V_{DD}$ is the power supply voltage, and $$I_4 = \frac{V_P}{R_{eq}},$$

where $R_{eq}$ is an equivalent resistance of the variable resistor 600.

The equivalent resistance $R_{eq}$ of the variable resistor 600 is as follows:

$$R_{eq} = \frac{1}{2Cf},$$

where C is the common capacitance of capacitors C7 and C8, and f is the common frequency of the timing signals φ1:φN.

Therefore, the equivalent resistance $R_{eq}$ can be written as:

$$R_{eq} = \frac{V_P}{I_4} = \frac{V_{DD} - V_{th\_MP4}}{I_4} - \sqrt{\frac{2}{I_4 \mu_P C_{ox} \left(\frac{W}{L}\right)_{MP4}}}.$$

When solved for the source current $I_4$, the following is obtained:

$$I_4 = \frac{V_{DD} - V_{th\_MP4}}{R_{eq}} + \frac{1}{\mu_P C_{ox}\left(\frac{W}{L}\right)_{MP4} R_{eq}^2}\left[1 - \sqrt{1 + 2\mu_P C_{ox}\left(\frac{W}{L}\right)_{MP4}(V_{DD} - V_{th\_MP4})R_{eq}^2}\right]$$

When the equivalent resistance is substituted, the source current $I_4$ can be rewritten as:

$$I_4 = (V_{DD} - V_{th\_MP4})2Cf +$$

-continued $$\frac{4C^2}{\mu_P C_{ox}\left(\frac{W}{L}\right)_{MP4}}f^2\left[1-\sqrt{1+\frac{2\mu_P C_{ox}\left(\frac{W}{L}\right)_{MP4}(V_{DD}-V_{th\_MP4})}{2Cf}}\right]$$

Since $$\frac{4C^2}{\mu_P C_{ox}\left(\frac{W}{L}\right)_{MP4}}f^2 \ll 1,$$

the source current $I_4$ can be reduced to:

$$I_4=(V_{DD}-V_{th\_MP4})2Cf.$$

If transistors MP4 and MP5 are equal in size, and transistors MN3 and MN4 are equal in size, then the second reference current $I_{REF2}$ is:

$$I_{REF2}=(V_{DD}-V_{th\_MP4})2Cf.$$

Therefore, since the first reference current $I_{REF1}$ is the difference of the drain current $I_{D3}$ and the second reference current $I_{REF2}$ (i.e., $I_{REF1}=I_{D3}-I_{REF2}$), then the variable reference voltage $V_{REF}$ is the product of the resistor R4 and the first reference current $I_{REF1}$ (i.e., $V_{REF}=R4\times I_{REF1}$). In various embodiments, the value of the first reference current $I_{REF1}$ may be larger than the value of the second reference current $I_{REF2}$ due to the temperature characteristics of the secondary circuit 625.

Therefore, the variable reference voltage $V_{REF}$, can be written as:

$$V_{REF}=R4[I_{D3}-(V_{DD}-V_{th\_MP4})2Cf].$$

Figure 8A:
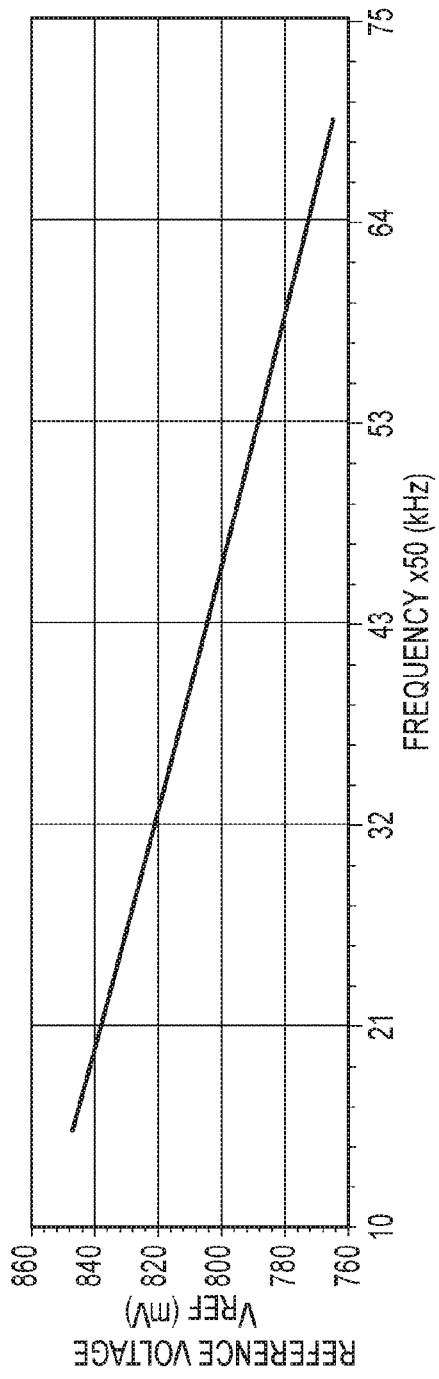
FIG. 8A is a graph illustrating reference voltages versus frequency in accordance with an exemplary embodiment of the present technology.
Figure 8B:
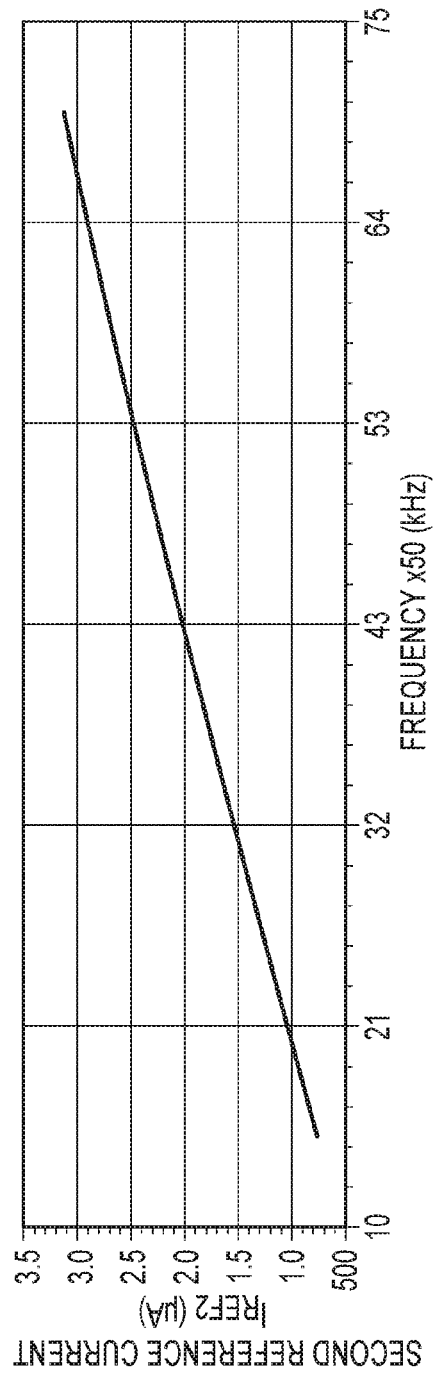
FIG. 8B is a graph illustrating current versus frequency in accordance with an exemplary embodiment of the present technology.

Referring to FIGS. 8A and 8B, in an exemplary embodiment, the reference voltage $V_{REF}$ may be inversely proportional to the frequency f of the timing signals φ1:φN, while the second reference current $I_{REF2}$ may be proportional to the frequency f of the timing signals φ1:φN.

In various embodiments, since the reference voltage $V_{REF}$ is based on the frequency f of the timing signals φ1:φN, the DAC 300 also operates based on the frequency f of the timing signals φ1:φN. In various embodiments, the value of reference voltage $V_{REF}$ transmitted to the DAC 300 affects the full scale voltage $V_{pp}$ (i.e., a peak-to-peak voltage), since:

$$V_{pp}=2\times\frac{C_{DAC}}{C1}\times V_{REF}.$$

In various embodiments, as the reference voltage $V_{REF}$ increases, the full scale voltage $V_{pp}$ also increases, and vice versa.

Figure 9:
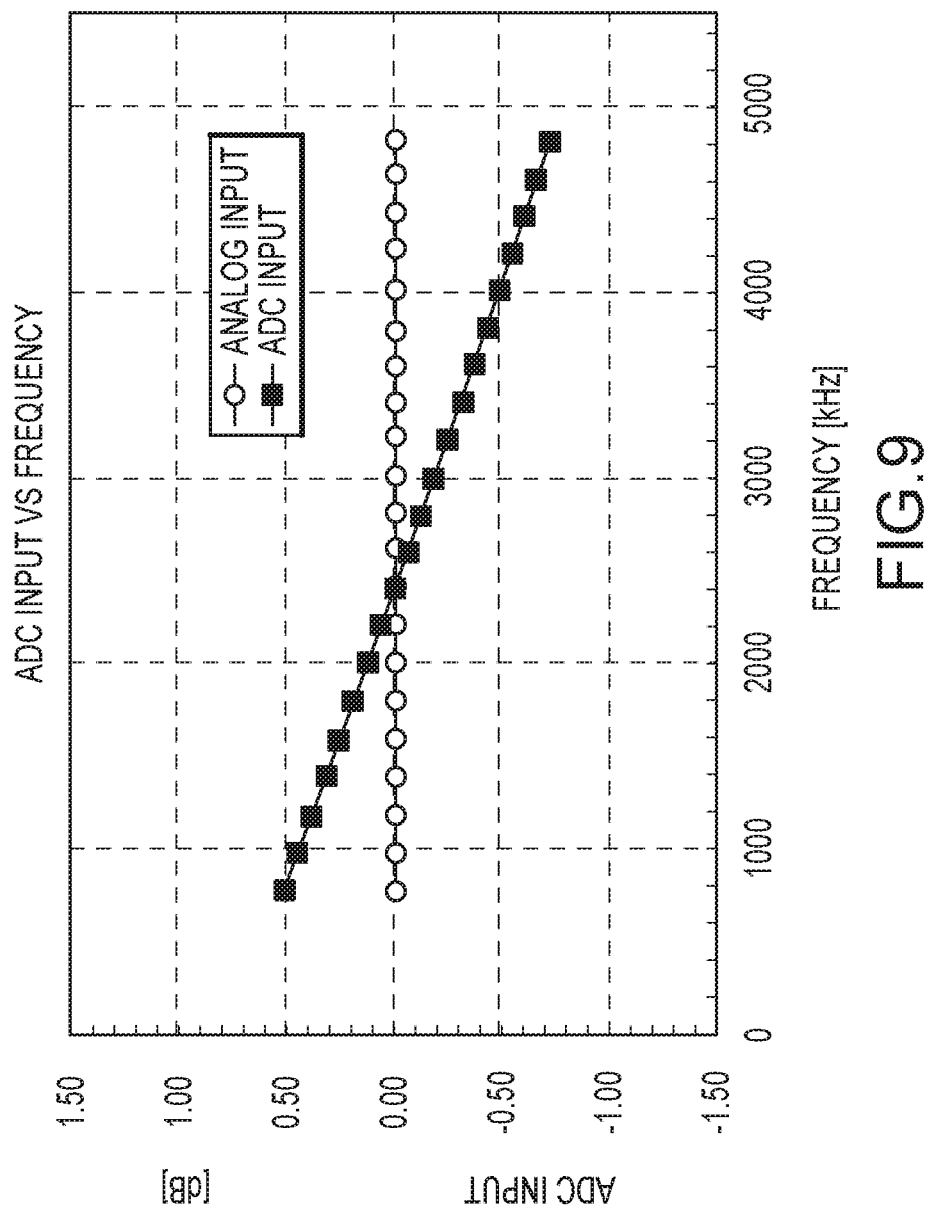
FIG. 9 is a graph illustrating ADC input values versus frequency in accordance with an exemplary embodiment of the present technology.
Figure 10:
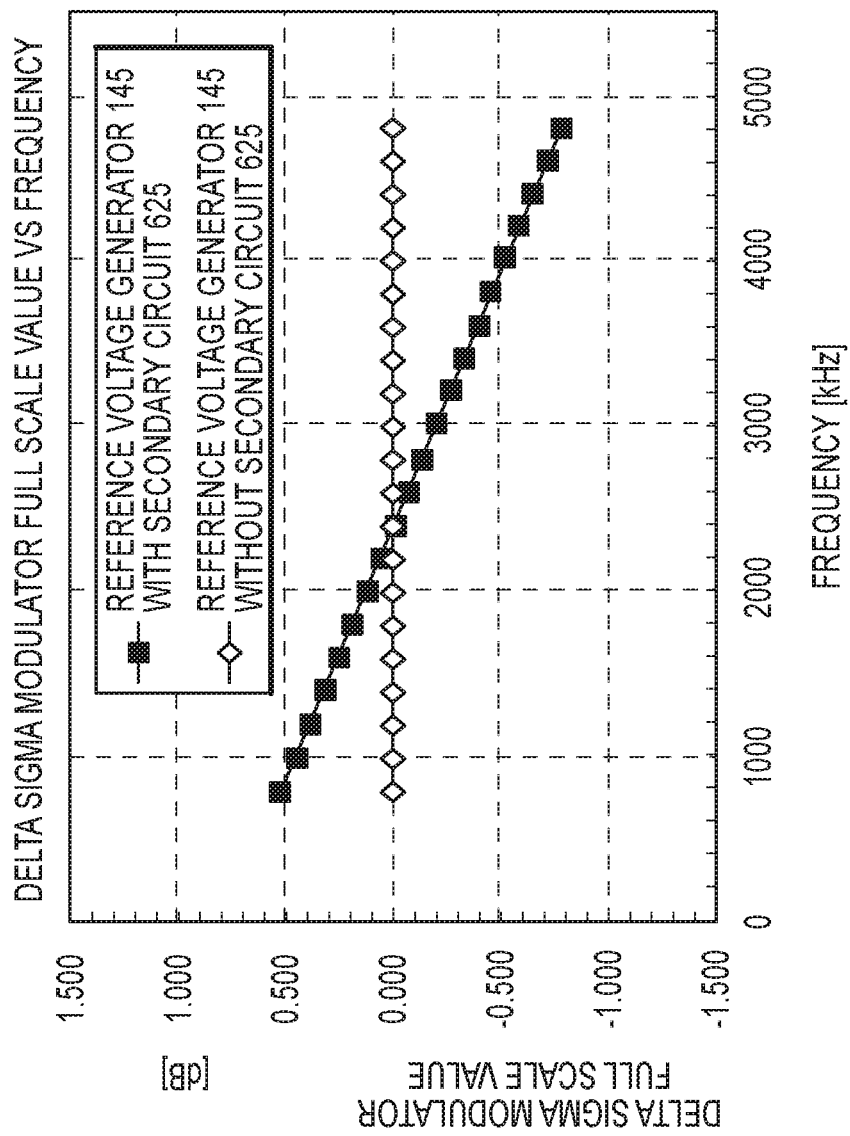
FIG. 10 is a graph illustrating delta-sigma modulator full scale values versus frequency in accordance with an exemplary embodiment of the present technology.

According to various embodiments, and referring to FIGS. 9 and 10, the reference voltage generator 145 used in conjunction with the DAC 300 of the delta-sigma modulator 200 may operate to adjust the range of the full scale value of the delta-sigma modulator 200 to match the range of the full scale value of the input signal $ADC_{IN}$. By adjusting the range of the full scale value to match that of the input signal $ADC_{IN}$, the difference between the two is substantially zero volts, or zero decibels dB, which effectively cancels the input signal $ADC_{IN}$ variation.

Figure 11:
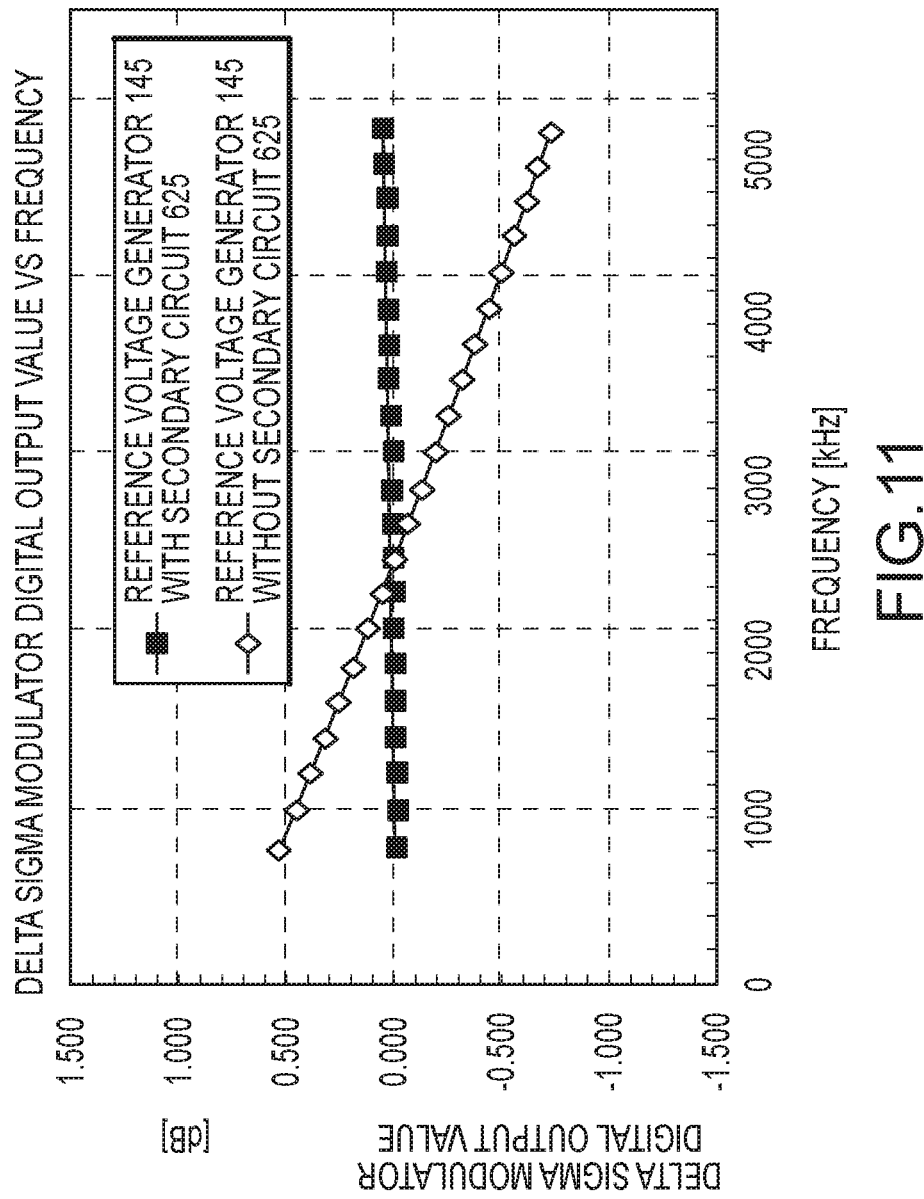
FIG. 11 is a graph illustrating delta-sigma modulator digital output values versus frequency in accordance with an exemplary embodiment of the present technology.

Therefore, and referring to FIG. 11, the digital output 340 value of the delta-sigma modulator 200 is substantially constant and is not affected by the frequency f of the timing signals φ1:φN. Conversely, in conventional ADCs where the reference voltage $V_{REF}$ is not based on the frequency f (e.g., an ADC utilizing a reference voltage generator without a current generator circuit, such as secondary circuit 625) of the timing signals φ1:φN, the digital output 340 value of the delta-sigma modulator 200 is affected by the frequency f.

Referring again to FIG. 2, according to various embodiments, the digital circuit 205 coupled to the delta-sigma modulator 200 may be designed to process a range of outputs 340 that is less than those in conventional ADCs. As such, the digital circuit 205 may be simple in design, for example requiring fewer components, and therefore, consuming less power and occupying a smaller chip area than a conventional digital circuit.

Referring again to FIGS. 3, 6, and 7, according to various embodiments, common elements, such as the resistive elements and the capacitive elements, may be formed from the same materials for improved performance. In an exemplary embodiment, the resistive elements of the first filter 120 and the reference voltage generator 145, for example resistors R, R1:R7, may be formed from the same materials. For example, the resistive elements may comprise a polysilicon resistor, a diffusion resistor, or a well resistor. In addition, the capacitive elements, for example the sampling capacitor C1, the feedback capacitor C2, the capacitor $C_{LP}$, and capacitors C4, C5, C6, C7, C8 may be formed from the same materials. For example, the capacitive elements may comprise a poly-insulator-poly capacitor, a metal-insulator-metal capacitor, or a MOSFET (metal-oxide semiconductor field-effect transistor) gate capacitor.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An integrated circuit capable of receiving an input signal with a first voltage range, comprising:
   a phase generator configured to generate a timing signal;
   a reference voltage generator responsive to the phase generator and configured to generate a reference voltage comprising a magnitude that is inversely proportional to a frequency of the timing signal; and
   an analog-to-digital converter with an adjustable full scale voltage, coupled to the reference voltage generator and responsive to the reference voltage;
   wherein:
      the adjustable full scale voltage is adjusted to substantially match the first voltage range; and
      the analog-to-digital converter transmits a digital value with a substantially constant voltage.

2. The integrated circuit of claim 1, further comprising a resistive element and a capacitive element coupled in series and coupled to an input terminal of the analog-to digital converter.

3. The integrated circuit of claim 1, wherein the analog-to-digital converter comprises a digital-to-analog converter coupled to an output terminal of the analog-to-digital converter and the reference voltage generator, wherein the digital-to-analog converter receives the reference voltage.

4. The integrated circuit of claim 1, wherein the analog-to-digital converter comprises a delta-sigma modulator having a fully differential topology.

5. The integrated circuit of claim 1, wherein the analog-to-digital converter further comprises a digital circuit coupled to an output terminal of the delta-sigma modulator, comprising a decimation filter and a high-pass filter.

6. The integrated circuit of claim 1, wherein the reference voltage generator comprises a primary circuit and a secondary circuit, wherein:
   the primary circuit generates a first current and the reference voltage;
   the secondary circuit generates a second current based on the frequency of the timing signal; and
   the first current is responsive to the second current.

7. The integrated circuit of claim 1, wherein the secondary circuit comprises a switched-capacitor resistor comprising a switching device and a capacitor.

8. The integrated circuit of claim 7, wherein the secondary circuit comprises a low-pass filter coupled to the switched-capacitor resistor and a current mirror.

9. A method for signal conversion utilizing an analog-to-digital converter, comprising:
   generating a timing signal with a frequency;
   generating a reference voltage according to the frequency of the timing signal, wherein the reference voltage is inversely proportional to the frequency of the timing signal;
   operating the analog-to-digital converter according to the reference voltage;
   outputting, at an output of the analog-to-digital converter, a digital output with a substantially constant value.

10. The method of claim 9, wherein operating the analog-to-digital converter according to the reference voltage results in matching a full scale voltage of the analog-to-digital converter with a voltage range of an input signal.

11. The method of claim 9, wherein operating the analog-to-digital converter comprises utilizing a digital-to-analog converter to receive the reference voltage and charging a capacitor to a voltage potential.

12. The method of claim 9, wherein operating the analog-to-digital converter comprises adjusting a full scale voltage of the analog-to-digital converter based on the reference voltage.

13. The method of claim 9, wherein generating the reference voltage comprises generating a variable reference current based on the frequency of the timing signal.

14. A system, comprising:
   a micro electro-mechanical device;
   a circuit coupled to the micro electro-mechanical device, comprising:
      a phase generator configured to generate a timing signal;
      a reference voltage generator, coupled to the phase generator, configured to generate a reference voltage that is inversely proportional to the frequency of the timing signal;
      an analog-to-digital converter coupled to the reference voltage generator, and configured to:
         receive an input signal, with a first voltage range, from the micro electro-mechanical device;
         operate according to the reference voltage;
         output a digital value that is substantially fixed regardless of the frequency of the timing signal;
      wherein a full scale voltage range of the analog-to-digital converter is adjusted according to the reference voltage.

15. The system of claim 14, wherein the micro electro-mechanical device comprises a microphone.

16. The system of claim 14, wherein the circuit further comprises:
   a low-pass filter coupled between an output signal of micro electro-mechanical device and an input of the analog-to-digital converter.

17. The system of claim 16, wherein the analog-to-digital converter comprises a delta-sigma modulator coupled to an output terminal of the low pass filter, wherein:
   the delta-sigma modulator is configured to receive the input signal with the first voltage range; and
   the delta-sigma modulator comprises a fully differential topology.

18. The system of claim 17, wherein the analog-to-digital converter further comprises: a digital circuit coupled to an output terminal of the delta-sigma modulator, comprising a decimation filter and a high-pass filter.

19. The system of claim 14, wherein the reference voltage generator comprises a primary circuit and a secondary circuit, wherein the secondary circuit generates a current based on the frequency of the timing signal, and the reference voltage generator is configured to generate a reference voltage according to the current of the secondary circuit.

20. The system of claim 19, wherein the secondary circuit comprises:
- a current mirror;
- a switched-capacitor resistor; and
- a low-pass filter.

* * * * *